US011901921B2

United States Patent
Fraticelli et al.

(10) Patent No.: US 11,901,921 B2
(45) Date of Patent: Feb. 13, 2024

(54) RADIO APPARATUS

(71) Applicant: Nokia Solutions and Networks Oy, Espoo (FI)

(72) Inventors: Felipe Fraticelli, Fort Worth, TX (US); Ramesh Patel, Frisco, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 78 days.

(21) Appl. No.: 17/512,997

(22) Filed: Oct. 28, 2021

(65) Prior Publication Data

US 2022/0140847 A1 May 5, 2022

(30) Foreign Application Priority Data

Nov. 2, 2020 (FI) ..................................... 20206098

(51) Int. Cl.
*H04B 1/00* (2006.01)
*H04B 1/04* (2006.01)

(52) U.S. Cl.
CPC ......... *H04B 1/0067* (2013.01); *H04B 1/0458* (2013.01); *H04B 1/0483* (2013.01)

(58) Field of Classification Search
CPC ...... H04B 1/005; H04B 1/0053; H04B 1/006; H04B 1/0067; H04B 1/0071; H04B 1/04; H04B 1/0458; H04B 1/0475; H04B 1/0483; H04B 2001/0408; H04B 2001/0416; H04B 2001/0425; H04B 2001/045;

(Continued)

(56) References Cited

U.S. PATENT DOCUMENTS

| 5,101,173 A | 3/1992 | DiPiazza et al. |
| 6,753,735 B2* | 6/2004 | Arai ..................... H03G 3/3042 330/285 |

(Continued)

FOREIGN PATENT DOCUMENTS

| CN | 1645755 A | 7/2005 |
| CN | 107529215 A | 12/2017 |

(Continued)

OTHER PUBLICATIONS

Office action received for corresponding Finnish Patent Application No. 20206098, dated Mar. 31, 2021, 9 pages.

(Continued)

*Primary Examiner* — Quochien B Vuong
(74) *Attorney, Agent, or Firm* — Harness, Dickey & Pierce, P.L.C.

(57) ABSTRACT

An apparatus is disclosed, comprising means for storing reference data indicative of characteristics for each of two or more amplifiers for amplifying signals in two or more respective bands, the reference data including voltage characteristics required by the particular amplifier to achieve a particular output power for a range of output power values for its respective frequency band. The apparatus may comprise means for receiving at least a first required output power for a first amplifier and a second required output power for a second amplifier, and determining, based on the reference data, the voltage characteristics required for the first amplifier to achieve the first required output power and the voltage characteristics required for the second amplifier to achieve the second required output power.

14 Claims, 9 Drawing Sheets

(58) Field of Classification Search
CPC ........ H03F 1/0211; H03F 1/30; H03F 1/3241;
H03F 1/3252; H03F 3/189; H03F 3/20;
H03F 3/211; H03F 3/24; H03F 2200/111;
H03F 2200/321; H03F 2200/39; H03F
2200/451; H03G 3/004
See application file for complete search history.

(56) References Cited

U.S. PATENT DOCUMENTS

| | | | |
|---|---|---|---|
| 6,784,748 B1* | 8/2004 | Canyon | H03F 3/245 |
| | | | 330/296 |
| 7,817,973 B1 | 10/2010 | Tuo | |
| 8,699,972 B2* | 4/2014 | Lee | H04B 1/005 |
| | | | 455/127.1 |
| 8,970,299 B2* | 3/2015 | Hase | H03F 3/245 |
| | | | 330/302 |
| 9,338,039 B1 | 5/2016 | Barnes | |
| 2003/0045252 A1* | 3/2003 | Nam | H03F 3/189 |
| | | | 455/127.1 |
| 2011/0130105 A1 | 6/2011 | Chan et al. | |
| 2012/0083229 A1 | 4/2012 | Kenington | |
| 2012/0200355 A1 | 8/2012 | Braithwaite | |
| 2013/0059546 A1 | 3/2013 | Lum et al. | |
| 2014/0253231 A1 | 9/2014 | Reinwald et al. | |
| 2014/0266460 A1 | 9/2014 | Nobbe et al. | |
| 2014/0327483 A1* | 11/2014 | Balteanu | H03F 3/68 |
| | | | 330/295 |
| 2015/0049841 A1 | 2/2015 | Laporte et al. | |
| 2016/0269057 A1 | 9/2016 | Chang | |
| 2016/0285485 A1 | 9/2016 | Fehri et al. | |
| 2019/0123702 A1 | 4/2019 | Trainor et al. | |
| 2019/0312613 A1 | 10/2019 | Guan | |
| 2020/0028476 A1 | 1/2020 | Kim et al. | |
| 2020/0195203 A1 | 6/2020 | Braun et al. | |

FOREIGN PATENT DOCUMENTS

| | | |
|---|---|---|
| CN | 109088646 A | 12/2018 |
| EP | 2372905 A1 | 10/2011 |
| WO | 2019/032337 A1 | 2/2019 |
| WO | 2019/110327 A1 | 6/2019 |

OTHER PUBLICATIONS

Lee et al., "Digital PreDistortion for Concurrent Dual-Band Transmitter with a Single Feedback Path", International Journal of Control and Automation, vol. 10, No. 2, 2017, pp. 303-314.

Liu et al., "Concurrent Dual-Band Digital Predistortion With a Single Feedback Loop", IEEE Transactions on Microwave Theory and Techniques, vol. 63, No. 5, May 2015, pp. 1556-1568.

Office action received for corresponding Finnish Patent Application No. 20206097, dated Mar. 8, 2021, 8 pages.

Extended European Search Report received for corresponding European Patent Application No. 21204635.3, dated Mar. 11, 2022, 9 pages.

Extended European Search Report received for corresponding European Patent Application No. 21205501.6, dated Mar. 21, 2022, 9 pages.

Chinese Office Action for Chinese Application No. 202111282636.6 dated Dec. 6, 2023.

* cited by examiner

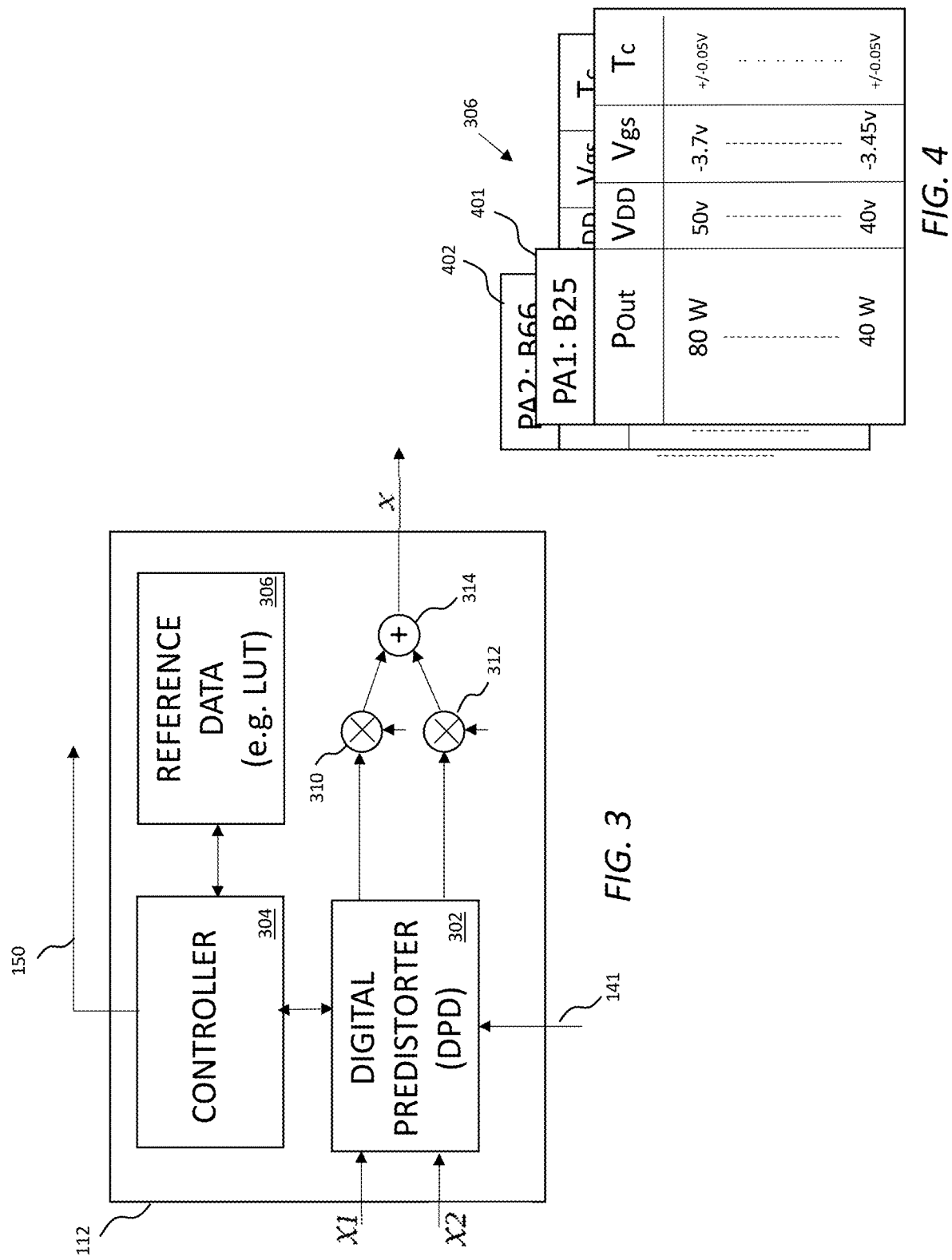

RADIO APPARATUS

FIELD

Embodiments relate to a radio apparatus and methods for configuring a radio apparatus.

BACKGROUND

In the context of wireless radio frequency (RF) networks, operators may enable transmission and/or reception of signals over multiple frequency bands at any given site, e.g. at a base station. For various reasons, an operator may provide multiple radio apparatuses at a given site, each apparatus comprising a high-efficiency power amplifier to cover a particular band. As an alternative, operators may provide a wideband radio apparatus with a wideband power amplifier that covers the required bands. Each option has various benefits and disadvantages.

SUMMARY

The scope of protection sought for various embodiments of the invention is set out by the independent claims. The embodiments and features, if any, described in this specification that do not fall under the scope of the independent claims are to be interpreted as examples useful for understanding various embodiments of the invention.

According to a first aspect, there is described an apparatus comprising means for: storing reference data indicative of characteristics for each of two or more amplifiers for amplifying signals in two or more respective bands, the reference data including voltage characteristics required by the particular amplifier to achieve a particular output power for a range of output power values for its respective frequency band; receiving at least a first required output power for a first amplifier and a second required output power for a second amplifier; and determining, based on the reference data, the voltage characteristics required for the first amplifier to achieve the first required output power and the voltage characteristics required for the second amplifier to achieve the second required output power.

The reference data may include voltage characteristics required by the respective first and second amplifiers to achieve a particular output power for a range of output power values for its respective frequency band while meeting one or more predetermined performance requirements, such as one or more of efficiency, maintain group delay variation and an out-of-band rejection.

The stored voltage characteristics may comprise a drain voltage and a gate bias voltage required for a particular amplifier to achieve a particular output power for its respective radio frequency band. The stored voltage characteristics may further comprise a value of temperature compensation.

The stored voltage characteristics may comprise values determined in a testing phase when the two or more amplifiers and/or signal processing components associated with the two or more amplifiers are configured to meet one or more predetermined performance requirements.

The apparatus may further comprise a filter associated with each amplifier of the two or more amplifiers, wherein, in the testing phase, the filters are configured to meet the one or more predetermined performance requirements. The filters may be configured by means of setting their respective centre frequencies so as to be skewed with respect to that of a linearizing means associated with the same radio frequency band.

The linearizing means may be digital pre-distorter.

The centre frequency may be skewed with respect to that of the linearizing means such as to set or maintain group delay variation below a predetermined threshold.

The centre frequency may skewed with respect to that of the linearizing means such as to provide an out-of-band rejection characteristic above a predetermined threshold.

The apparatus may further comprise means for transmitting an indication of the determined voltage characteristics to a power supply associated with the two or more amplifiers.

The reference data may be preconfigured in a memory of the apparatus prior to deployment. The reference data may be stored in a look-up table of the memory.

The apparatus may further comprise means for computing the required output power values for the two or more amplifiers based on a commissioned total power specified for the apparatus.

The computing means may be configured to: receive a first input indicative of a commissioned total power; receive a second input indicative of a first commissioned output power value for a first amplifier of the two or more amplifiers; set the first commissioned output power value as the first required output power value if it does not exceed the commissioned total power; receive a third input indicative of a second commissioned output power value for a second amplifier of the two or more amplifiers; and set the second commissioned output power value as the second required output power value if, when summed with the first commissioned output power value, it does not exceed the commissioned total power.

The apparatus may further comprise means for re-computing one or more required output power values responsive to a change in the other one of the required output values such that the sum of the required power values does not exceed the commissioned total power.

The two or more amplifiers may be power amplifiers for connection to a common antenna. The common antenna may be remote from the apparatus.

The apparatus may a radio module for a radio access network base station.

According to a second aspect, there is described a method comprising: storing reference data indicative of characteristics for each of two or more amplifiers for amplifying signals in two or more respective bands, the reference data including voltage characteristics required by the particular amplifier to achieve a particular output power for a range of output power values for its respective frequency band; receiving at least a first required output power for a first amplifier and a second required output power for a second amplifier; and determining, based on the reference data, the voltage characteristics required for the first amplifier to achieve the first required output power and the voltage characteristics required for the second amplifier to achieve the second required output power.

The reference data may include voltage characteristics required by the respective first and second amplifiers to achieve a particular output power for a range of output power values for its respective frequency band while meeting one or more predetermined performance requirements, such as one or more of efficiency, maintain group delay variation and an out-of-band rejection.

The stored voltage characteristics may comprise a drain voltage and a gate bias voltage required for a particular amplifier to achieve a particular output power for its respective radio frequency band. The stored voltage characteristics may further comprise a value of temperature compensation.

The stored voltage characteristics may comprise values determined in a testing phase when the two or more amplifiers and/or signal processing components associated with the two or more amplifiers are configured to meet one or more predetermined performance requirements.

The method may further comprise configuring a filter associated with each amplifier of the two or more amplifiers, wherein, in the testing phase, the filters are configured to meet the one or more predetermined performance requirements. The filters may be configured by means of setting their respective centre frequencies so as to be skewed with respect to that of a linearizing means associated with the same radio frequency band. The linearizing means may be digital pre-distorter. The centre frequency may be skewed with respect to that of the linearizing means such as to set or maintain group delay variation below a predetermined threshold. The centre frequency may skewed with respect to that of the linearizing means such as to provide an out-of-band rejection characteristic above a predetermined threshold.

The method may further comprise transmitting an indication of the determined voltage characteristics to a power supply associated with the two or more amplifiers.

The reference data may be preconfigured in a memory of the apparatus prior to deployment. The reference data may be stored in a look-up table of the memory.

The method may further comprise computing the required output power values for the two or more amplifiers based on a specified total power.

Computing may comprise receiving a first input indicative of a commissioned total power; receiving a second input indicative of a first commissioned output power value for a first amplifier of the two or more amplifiers; setting the first commissioned output power value as the first required output power value if it does not exceed the commissioned total power; receiving a third input indicative of a second commissioned output power value for a second amplifier of the two or more amplifiers; and setting the second commissioned output power value as the second required output power value if, when summed with the first commissioned output power value, it does not exceed the commissioned total power.

The method may further comprise re-computing one or more required output power values responsive to a change in the other one of the required output values such that the sum of the required power values does not exceed the commissioned total power.

The two or more amplifiers may be power amplifiers for connection to a common antenna.

The method may be performed by a radio module for a radio access network base station.

According to a third aspect, there is provided a method, comprising: determining reference data indicative of characteristics for each of two or more amplifiers of a radio apparatus, wherein the amplifiers are configured for amplifying respective signals in respective different frequency bands, the reference data including voltage characteristics required by the particular amplifier to achieve each of a range of output power values for its respective frequency band, wherein the method comprises determining the voltage characteristics in a testing stage when the two or more amplifiers and/or signal processing components associated with the two or more amplifiers are configured to meet one or more predetermined performance requirements.

The radio apparatus may comprise a filter associated with each amplifier of the two or more amplifiers, wherein the method comprises, in the testing phase, configuring the filters to meet the one or more predetermined performance requirements.

The filters may be configured by means of setting or tuning their respective centre frequencies so as to be skewed with respect to that of a linearizing means associated with the same radio frequency band. The linearizing means may be a digital pre-distorter. The centre frequency may be skewed with respect to that of the linearizing means such as to set or maintain group delay variation below a predetermined threshold. The centre frequency may skewed with respect to that of the linearizing means such as to provide an out-of-band rejection characteristic above a predetermined threshold.

According to a fourth aspect, there is provided a work product comprising a look up table or array, created by means of the method of the third aspect.

According to a fifth aspect, there is provided a computer program product comprising a set of instructions which, when executed on an apparatus, is configured to cause the apparatus to carry out the method of: storing reference data indicative of characteristics for each of two or more amplifiers for amplifying signals in two or more respective bands, the reference data including voltage characteristics required by the particular amplifier to achieve a particular output power for a range of output power values for its respective frequency band; receiving at least a first required output power for a first amplifier and a second required output power for a second amplifier; and determining, based on the reference data, the voltage characteristics required for the first amplifier to achieve the first required output power and the voltage characteristics required for the second amplifier to achieve the second required output power.

According to a sixth aspect, there is provided a computer program product comprising a set of instructions which, when executed on an apparatus, is configured to cause the apparatus to carry out the method of: determining reference data indicative of characteristics for each of two or more amplifiers of a radio apparatus, wherein the amplifiers are configured for amplifying respective signals in respective different frequency bands, the reference data including voltage characteristics required by the particular amplifier to achieve each of a range of output power values for its respective frequency band, wherein the method comprises determining the voltage characteristics in a testing stage when the two or more amplifiers and/or signal processing components associated with the two or more amplifiers are configured to meet one or more predetermined performance requirements.

According to a seventh aspect, there is provided a non-transitory computer readable medium comprising program instructions stored thereon for performing a method, comprising: storing reference data indicative of characteristics for each of two or more amplifiers for amplifying signals in two or more respective bands, the reference data including voltage characteristics required by the particular amplifier to achieve a particular output power for a range of output power values for its respective frequency band; receiving at least a first required output power for a first amplifier and a second required output power for a second amplifier; and determining, based on the reference data, the voltage characteristics required for the first amplifier to achieve the first required output power and the voltage characteristics required for the second amplifier to achieve the second required output power.

The program instructions of the seventh aspect may also perform operations according to any preceding method definition of the second aspect.

According to an eighth aspect, there is provided a non-transitory computer readable medium comprising program instructions stored thereon for performing a method, comprising: determining reference data indicative of characteristics for each of two or more amplifiers of a radio apparatus, wherein the amplifiers are configured for amplifying respective signals in respective different frequency bands, the reference data including voltage characteristics required by the particular amplifier to achieve each of a range of output power values for its respective frequency band, wherein the method comprises determining the voltage characteristics in a testing stage when the two or more amplifiers and/or signal processing components associated with the two or more amplifiers are configured to meet one or more predetermined performance requirements.

The program instructions of the eighth aspect may also perform operations according to any preceding method definition of the third aspect.

According to a ninth aspect, there is provided an apparatus comprising: at least one processor; and at least one memory including computer program code which, when executed by the at least one processor, causes the apparatus: to store reference data indicative of characteristics for each of two or more amplifiers for amplifying signals in two or more respective bands, the reference data including voltage characteristics required by the particular amplifier to achieve a particular output power for a range of output power values for its respective frequency band; to receive at least a first required output power for a first amplifier and a second required output power for a second amplifier; and to determine, based on the reference data, the voltage characteristics required for the first amplifier to achieve the first required output power and the voltage characteristics required for the second amplifier to achieve the second required output power.

According to a tenth aspect, there is provided an apparatus comprising: at least one processor;

and at least one memory including computer program code which, when executed by the at least one processor, causes the apparatus: to determine reference data indicative of characteristics for each of two or more amplifiers of a radio apparatus, wherein the amplifiers are configured for amplifying respective signals in respective different frequency bands, the reference data including voltage characteristics required by the particular amplifier to achieve each of a range of output power values for its respective frequency band, wherein the method comprises determining the voltage characteristics in a testing stage when the two or more amplifiers and/or signal processing components associated with the two or more amplifiers are configured to meet one or more predetermined performance requirements.

BRIEF DESCRIPTION OF DRAWINGS

Example embodiments will now be described by way of non-limiting example, with reference to the accompanying drawings, in which:

FIG. 3 is a block diagram of a processing module of the FIG. 2 circuit topology according to one or more example embodiments;

FIG. 4 is a representational view of one or more sets of reference data according to one or more example embodiments;

DETAILED DESCRIPTION

Example embodiments relate to a radio apparatus, signal processing methods for a radio apparatus and methods for configuring a radio apparatus.

A radio apparatus may comprise an apparatus configured to transmit and/or receive radio frequency (RF) signals in one or more predefined RF bands, hereafter referred to simply as "bands".

A radio apparatus may be referred to herein as a radio frequency module (RFM). One or more RFMs may be installed by a radio access network (RAN) operator at each of one or more base stations. A RFM may be considered self-contained unit comprising digital and analogue components for receiving and processing baseband input signals for coding, modulation and amplification via one or more power amplifiers, and transmission via an antenna connected to an output port of the apparatus. The RFM may also be configured to receive RF signals for demodulation although this disclosure may focus on the transmission chain. The antenna may be local or remote to the RFM. For example, the RFM may be connected to the antenna via a fibre cable for remote situations.

A RFM may be configured to transmit and/or receive RF signals using multiple (two or more) RF bands. The frequency ranges for uplink (UL) and downlink (DL) operation, and the centre frequency of a given band, among other parameters, are usually defined in national or international communications standards. For the avoidance of doubt, this disclosure relates to an RFM that is not limited to a particular number of bands, nor any particular type of modulation, radio access technology, standard or even hardware topology. For ease of explanation, this disclosure will focus on an example cellular base station RFM configured to provide two distinct bands for transmission, such as the B25 and B66 bands for 4G LTE. The B25 band has an uplink frequency range of 1850-1915 MHz and a downlink frequency range of 1930-1995 MHz. The B66 band has an uplink frequency range of 1710-1780 MHz and a downlink frequency range of 2110-2200 MHz.

Example embodiments are applicable to other generations of RAN, including 2G, 3G, 5G and future generational systems, and may also be applicable to WiFi and Wimax RFMs.

Figure 1:
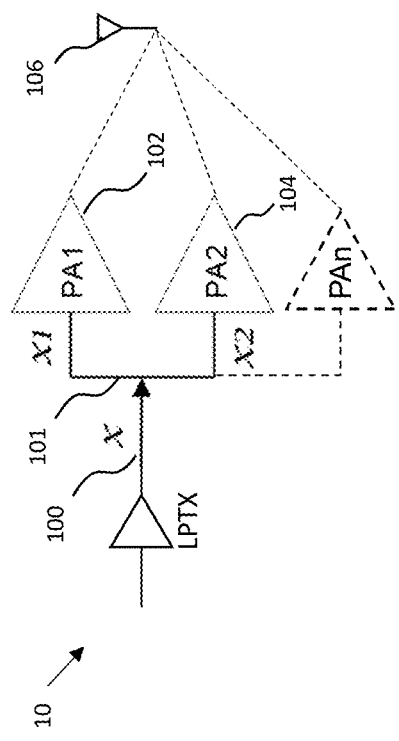
FIG. 1 is a schematic diagram of a circuit topology.

Referring to FIG. 1, a diplexed power amplifier (PA) topology 10 is shown.

The diplexed PA topology 10 comprises a common feed 100 from a so-called Low Power Transmission (LPTX) stage. The common feed 100 provides a low power composite signal x, comprising the sum or combination of signals x1, x2 in, for this example, two different bands, to a diplexer 101. The diplexer 101 may be referred to as a splitter or frequency multiplexer. The diplexer 101 may comprise first and second band pass filters (not shown) for respectively filtering the composite signal x so as to pass a signal x1 for a first band to a first PA 102 and a signal x2 for a second band, different from the first band, to a second PA 104. The first PA 102 and second PA 104 are therefore configured to amplify signals in different respective bands.

The amplified first and second signals may be provided to an RF antenna 106 via duplexer filters 152, 153. The RF antenna 106 may be common to the first and second PAs 102, 104.

The RF antenna 106 may be local or remote to the RFM comprising the FIG. 1 topology. For example, the RF antenna 106 may be some distance from the RFM and connected via a fibre cable.

Example embodiments disclosed herein relate to an RFM based on the FIG. 1 topology 10, or similar. As shown in FIG. 1, the diplexed PA topology 10 is not limited to two PAs and therefore not limited to two bands. Each PA is associated with a particular band and uses a diplexer, or equivalent, comprising filters appropriate to the respective bands. The bands may be set at a commissioning stage when the customer requests the RFM manufacturer to provide an RFM configured for their requirements.

Advantages that follow may include the ability to cover multiple bands in a single RFM using lower-bandwidth PAs which, compared with wideband PAs, inherently have higher efficiencies, for example in terms of power transfer and/or RF emissions. Compared with using multiple RFMs (one per band) there may also be space and cost savings as well as savings relating to maintenance and customization requirements per site. Further advantages will be explained herein, including the ability for the RFM to provide an optimised or tailored performance and for the PAs of the RFM to provide customised output powers based on the total output power which may be limited by the antenna 106.

Figure 2:
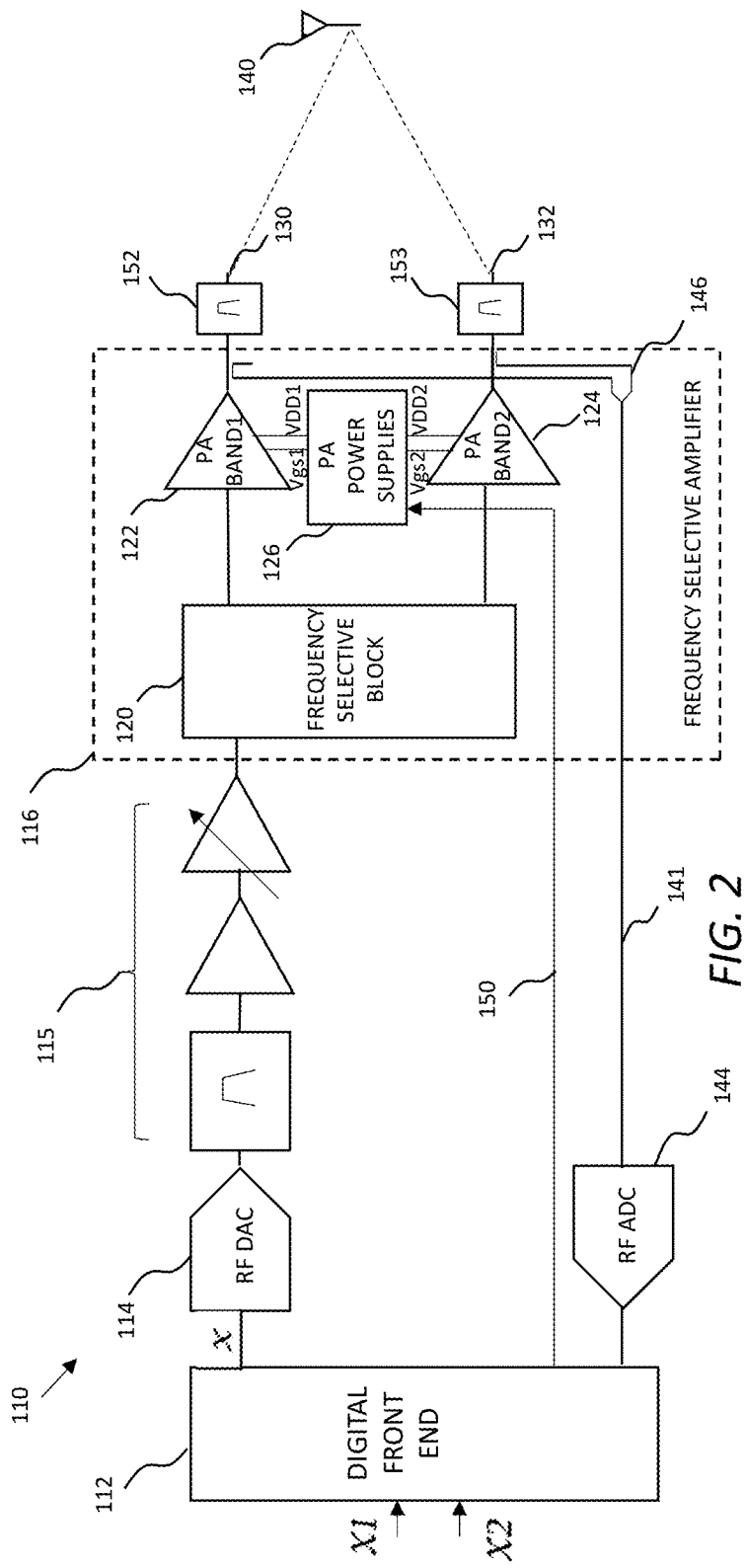
FIG. 2 is a more detailed schematic diagram of a system including a circuit topology according to one or more example embodiments.

Referring to FIG. 2, a schematic diagram of an RFM 110 is shown which is based on the FIG. 1 topology.

The RFM 110 may comprise a digital front end (DFB) 112.

The DFE 112 may comprise one or more digital processing modules, for example one or more Field Programmable Gate Arrays (FPGAs), Application Specific Integrated Circuits (ASICs) or any one or more processors or controllers configured to perform digital signal processing (DSP) operations on respective input signals x1, x2 to be transmitted on the two or more different bands.

An example digital signal processing operation may comprise linearization.

PAs will generally exhibit a nonlinear signal input to output characteristic, particularly for higher output powers. Hence, a linearizing component, commonly referred to as a Digital Predistorter (DPD), is provided to correct or compensate the non-linearity characteristic of the PA. The non-linearity characteristic may be determined based on comparing the PAs input signal (in digital form) to its output signal. The latter is fed back to the DPD for this purpose. The DPD generates a model of the PA's non-linearity characteristic which is essentially a filter model having an associated frequency characteristic or "DPD band". The DPD is said to 'predistort' the input signal effectively as the inverse of the non-linearity characteristic.

Other DSP operations may comprise encoding and/or modulation of input signals using carriers appropriate for the respective bands. In the case where first and second input signals x1, x2 are received for transmission over first and second bands, the DFE 112 may also sum or combine the first and second predistorted and modulated signals x1, x2 to provide the composite signal x which forms an output of the DFE 112.

The composite signal x is provided to an RF Digital to Analogue Converter (DAC) 114, a LPTX stage 115, and then, as shown in FIG. 2, a so-called frequency selective amplifier 116.

The frequency selective amplifier 116 may comprise a so-called frequency selective block (FSB) 120 which will be explained later on.

The frequency selective amplifier 116 may also comprise, in this example, first and second PAs 122, 124 respectively associated with first and second bands over which the first and second signals x1, x2 are to be transmitted.

A power supply 126 may provide one or more of d.c. and bias voltages to the first and second PAs 122, 124. Their values may be independent of one another. For example, the power supply 126 may provide a certain drain voltage (VDD1) to the first PA 122 and the same or a different drain voltage (VDD2) to the second PA 124. For example, the power supply 126 may provide a certain gate bias voltage (Vgs1) to the first PA 122 and the same or a different gate voltage (Vgs2) to the second PA 124.

The d.c. and/or bias voltages to the first and second PAs 122, 124 may be controlled by the DFE 112 as will be explained below.

The outputs of the first and second PAs 122, 124 may be connected to respective output ports 130, 132 for connection to an RF antenna 140 as shown. The RF antenna 140 does not necessarily comprise part of the RFM 110.

The outputs of the first and second PAs 122, 134 may also be fed-back to the DFE 112 using a common feedback line 141, via an RF Analogue to Digital Converter (ADC) 142, to provide a reference signal for the DPD as mentioned above. A switch 146 may be provided for this purpose, for example configured so that only one respective output of the first and second PAs 122, 124 is connected to the common feedback line 141 at a given time.

Note that the RFM 110 shown in FIG. 2 is shown with transmission-related components only. It should be understood that the RFM 110 may also receive signals using the RF antenna 140 for demodulation by the DFE 112.

FIG. 3 is a block diagram showing some components of the DFE 112.

The DFE 112 may comprise a DPD 302. The DPD 302 may be a dedicated processor or controller, or may be some processing engine embedded within the DFE. The DPD 302 implements one or more computational algorithms for modelling the inherent nonlinearity of each of the first and second PAs 122, 124, and based on said models, performing predistortion of the input signals x1, x2 using the corresponding models to counter the nonlinearities.

As indicated above, the common feedback line 141 provides a reference signal to the DPD 302 from, at a particular time, one of the first and second PAs 122, 124. For example, a reference signal based on the output of the first PA 122 is compared with the corresponding input signal x1 to determine, in effect, the transfer function of the first PA. This may generate a first DPD model. For example, a reference signal based on the output of the second PA 124 is compared with the corresponding input signal x2 to determine, in effect, the transfer function of the second PA. This may generate a second DPD model.

The DPD 302 is therefore configured to generate inverse functions of the first and second DPD models for predistorting the first and second signals x1, x2. The DPD 302 may implement one DPD algorithm or separate DPD algorithms, one for each of the first and second PAs 122, 124 based on their respective bands. Each DPD model will have a respective DPD band which covers the band of its corresponding PA.

The predistorted first and second signals x1, x2 generated by the DPD 302 are encoded/modulated by respective elements 310, 312 for the first and second bands and then summed or combined at an element 314 to provide the composite signal x. The composite signal x is then routed to the RF DAC 114 and subsequent LPTX 115.

The composite signal x can be any of, but is not limited to, LTE+LTE, LTE+GSM, LTE+WCDMA or LTE+5G NR carrier radio access technologies.

The DFE 112 may also comprise a controller 304 and a set of reference data 306. In some embodiments, the controller 304 may be a dedicated processor separate from the DFE 112. The controller 304 may be configured by means of hardware, software or firmware to perform certain processing functions within, or in association with, the RFM 110 based on one or more sets of reference data 306 to be described below.

The reference data 306 may be stored in a memory of the DFE 112 or in a separate memory accessible by the controller 304. For example, the reference data may be stored on one or more of the PAs 122, 124.

The reference data 306 may comprise any form of data structure stores characteristics associated with each of the first and second PAs 122, 124 as configured within the particular RFM 110. For example, the reference data 206 may comprise a work product such as an array or look-up table (LUT). Example embodiments may therefore provide a method of providing a work product by means of receiving a customer specification and generating reference data based on characterization testing to determine one or more settable values for achieving a required performance value, e.g. threshold, over a range of, for example, output powers.

In this respect, prior to deployment, the RFM 110 may be configured based on a customer's requirements. For example, the customer may specify one or more of a required number of bands (k) and the maximum output power of the antenna 140. The maximum output power of each of the first and second PAs 122, 124 may be determined as well as other power-related information such as the maximum and minimum ranges of VDD per PA, and Vgs per PA.

Configuration may also comprise modifying or tuning one or more components of the RFM 110, for example components of the FSB 120, to provide a required or optimised performance during characterization testing. For example, the DPD 302 can affect overall performance of the RFM 110 dependent on the efficiency of its linearizing algorithms.

Hence, improving performance of the DPD 302 may improve performance of the RFM 110 and tuning of the FSB 120 with regard to the DPD 302 is found to offer certain performance benefits.

When the required or optimized performance is achieved, the reference data 206, which may reflect voltage characteristics and/or other settable parameters required to achieve said measured performance, may be determined and stored as the reference data.

Therefore, the reference data 306 may be data which characterises the first and second PAs 122, 124 so that the RFM 110 provides a required or optimized performance.

For example, the reference data 306 may indicate voltage characteristics required for the first PA 122 to produce a particular output power at an optimal efficiency. The reference data 306 may provide the voltage characteristics over a range of output powers such that, for a given commissioned power requested by a customer, the reference data 306 may be accessed by the controller 304 to determine the voltage characteristics required to achieve the commissioned power in an optimally efficient way.

The controller 304 may then issue a control signal over a control line 150 to the power supply 126 to set the voltage characteristics of the first PA 122. Similarly, the controller 304 may issue a control signal to the power supply 126 for the second PA 124 to set its voltage characteristics.

The reference data 306 may therefore be derived at a testing stage, which may be performed prior to deployment to a customer site, and may relate to a specification for the RFM 110 provided by the customer. Each of the first and second PAs 122, 124 may undergo so-called characterization testing based on knowledge of which band each of the PAs is to be used with, as set by the customer, and the maximum output power required for the RFM.

FIG. 4 shows an example set of reference data 306 for the first and second PAs 122, 124. For example, a first LUT 401 may store voltage characteristics for the first PA 122, and a second LUT 402 may store voltage characteristics for the second PA 124.

For example, assume a customer requests an RFM 110 covering two specified bands, e.g. the B25 and B66 bands for 4G LTE. The customer may also specify a maximum output power for the RFM 110, e.g. 80 Watts, which may be based on one or more requirements, such as the maximum output power capability of an antenna they intend to use with the RFM.

Based on said specification, the manufacturer may locate an existing RFM 110 comprising the first and second PAs 122, 124, assuming they meet the maximum power requirements. The first and second PAs 122, 124 may then be configured for the B25 and B66 bands by means of the FSB 120. This configuration may involve selecting appropriate bandpass filters and signal processing to condition the filtered signals prior to input to the respective PAs 122, 124.

The purpose of such conditioning may be to provide some required performance, such as one or more of an improved or optimised efficiency, an optimised group delay variation and an improved or optimized out-of-band rejection. Any form of conditioning may be used at the testing and characterization stage.

Characterization testing may then involve applying input test signals to each of the first and second PAs 122, 124 when installed in the RFM.

For example, characterizing testing may involve applying test signals at frequencies within the B25 band to the first PA 122 and test signals at frequencies within the B66 band to the second PA 124.

By applying sweeping values of, for example, different VDDs and different Vgss (and, optionally, other variable parameters such as different compensation voltages to account for temperature) various metrics can be produced and analysed.

For example, a required VDD and Vgs to achieve each of a range of output powers can be determined for the first PA 122 and similarly for the second PA 124.

Values of efficiency can also be determined and hence the most optimal voltage characteristics, e.g. combination of VDD and Vgs for achieving specified output powers whilst meeting, for example, a minimum or optimal efficiency can be determined.

The result of characterization testing may produce a graph or set of values which provides the reference data 306 for the specific first and second PAs 122, 124 of the RFM 110.

By pre-loading the reference data 306, upon deployment to the customer site, the customer has the flexibility to set parameters such as which output power to assign to which of the first and second PAs 122, 124. The customer may for example input the required output powers via a user interface associated with the controller 304, which then accesses the reference data 306 and determines which voltage characteristics to use for setting the power supply 126.

Figure 5:
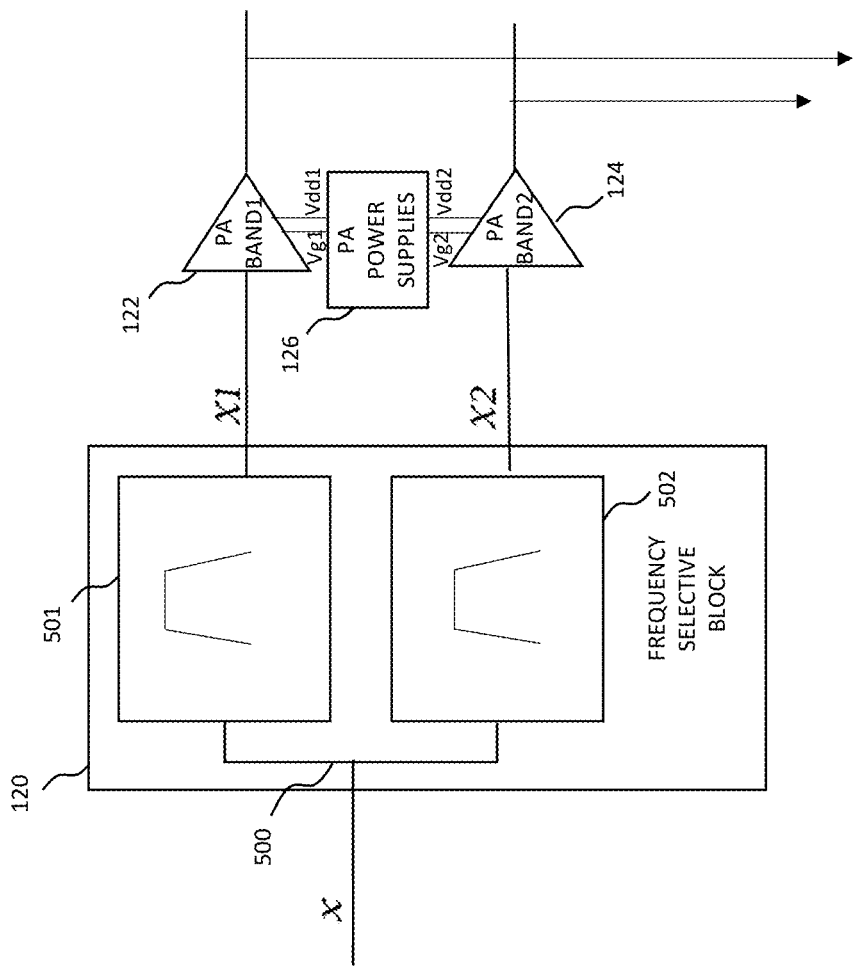
FIG. 5 is a block diagram of a frequency selective block, shown in FIG. 2, according to one or more example embodiments.

FIG. 5 is a block diagram of the FSB 120. As noted above, the FSB 120 is a part of the RFM 110 that may be configured during characterization testing to provide performance improvements. The FSB 120 receives the composite signal x from the LPTX 115 via a diplexer comprising first and second bandpass filters 501, 502 respectively associated with the first and second PAs 122, 124. The first and second bandpass filters 501, 502 are configured to pass the first and second predistorted input signals x1, x2 for the first and second bands to the first and second PAs 122, 124.

During characterization testing, the first and second bandpass filters 501, 502 are configured to condition said first and second input signals x1, x2. Conditioning may comprise configuring or tuning the first and second bandpass filters 501, 502 to provide a required performance, such as one or more of an improved or optimised efficiency, an optimised group delay variation and an improved or optimized out-of-band rejection. These may be based on a goal set by the customer, e.g. in relation to the DPD 302 to improve its linearizing efficiency, or based on a telecommunications standard or governmental requirement, for example to meet a required emissions target.

For example, it is found that by skewing the frequency responses of the first and second bands, e.g. by moving the centre frequency of each of the first and second bandpass filters 501, 502 in opposite directions, the resulting output signals from said bandpass filters may have a modified group delay variation, passband and attenuation level for outer band intermodulation distortions.

One or more of these modified characteristics may improve the processing efficiency of, for example, the DPD 302 in conjunction with the first and second PAs 122, 124.

At the testing stage, the first and second bandpass filters 501, 502 can be tuned to achieve the required characteristics.

The first and second bandpass filters 501, 502 of the FSB may condition the first and second signals x1, x2 in a manner that is synchronized with the DPD 302 to improve overall efficiency and performance.

Figure 6:
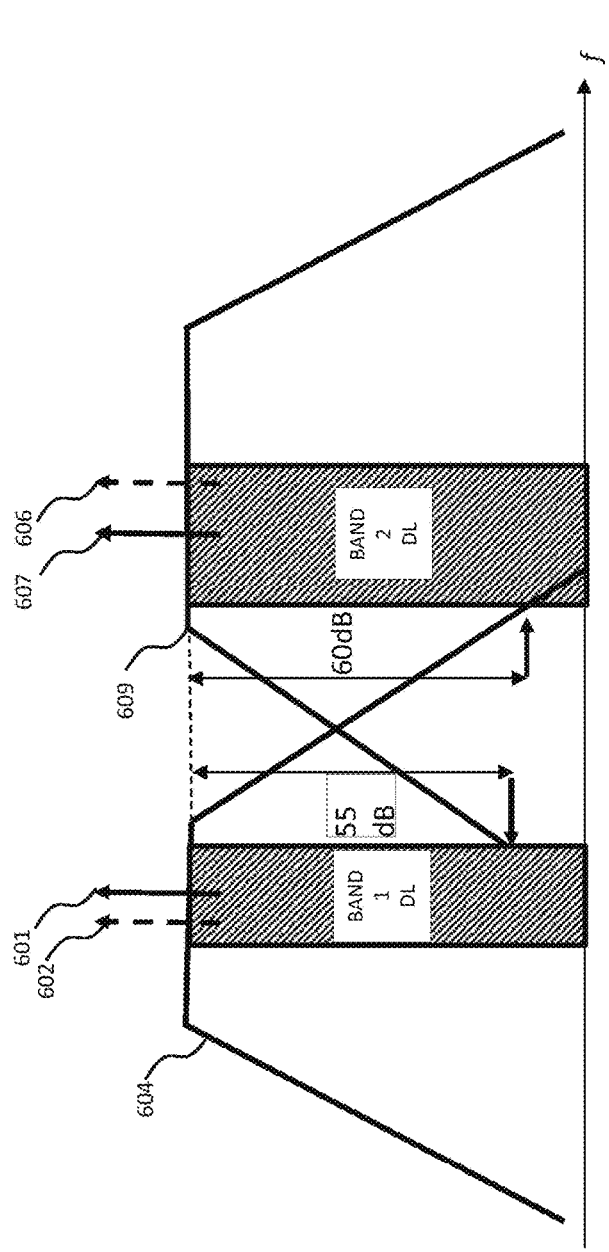
FIG. 6 is a representational view of filter frequency responses, useful for understanding aspects of one or more example embodiments.

For example, with reference to FIG. 6, it can be seen that the centre 602 of the first bandpass filter 501 of the FSB 120 may be configured such that it is skewed or shifted leftwards in the frequency domain, with respect to the centre frequency 601 of the frequency band 604. Similarly, it can be seen that the centre 606 of the second bandpass filter 502 of the FSB 120 may be configured such that it is skewed or shifted rightwards (opposite to that of the first bandpass filter 501) in the frequency domain with respect to the centre frequency 607 of the frequency band 609.

By skewing the centre frequencies 602, 606 in opposite directions, it is found that favourable out-of-band rejection values can be obtained, e.g. 55 dB and 60 dB as shown in the Figure which may be set as performance requirements. The DPD 302 may correct not only the intermodulation distortions in normal traffic but also dynamic distortions. Without an appropriate amount of out-of-band rejection, it will be harder for the DPD 302 to provide correction for all traffic scenarios.

Figure 7:
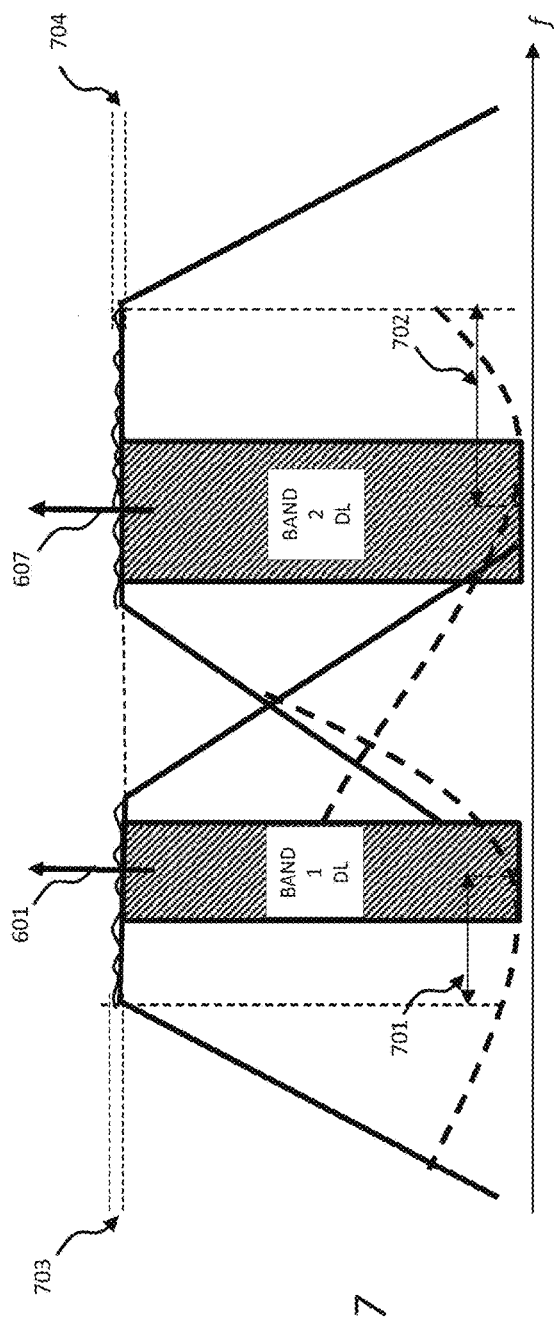
FIG. 7 is a representational view of filter frequency responses, useful for understanding aspects of one or more example embodiments.

With reference to FIG. 7, the effects of group delay variation and ripple are seen with respect to the same setup. Group delay variation 701, 702 and ripple 703, 704 may directly impact the amount of correction that the DPD 302 can provide. The larger the group delay variation 701, 702 and ripple 703, 704, the more computationally intensive it is for the DPD 302 to provide the required level of correction. Therefore, a general goal is to reduce or minimize the value of group delay variation and ripple. For example, typical values of group delay variation and ripples are 3 ns and 1.5 dB respectively.

Thus, an optimised FSB 120 will comprise first and second bandpass filters 501, 502 which exhibit high group delay variation for the frequencies between desired transmit bands.

Having configured the first and second bandpass filters 501, 502 to meet the one or more performance requirements, the PAs 122, 124 may be characterised in the above-mentioned characterization testing stage.

For example, the PAs 122, 124 may be characterized in terms of their behaviour and performance over the VDD capabilities of the RFM 110. Characterization testing may also take into account Vgs bias adjustments, temperature variation adjustments and/or any other characteristic where adjustments may influence and/or help the performance of the PA over the drain voltage adjustment and DPD correction.

Figure 8:
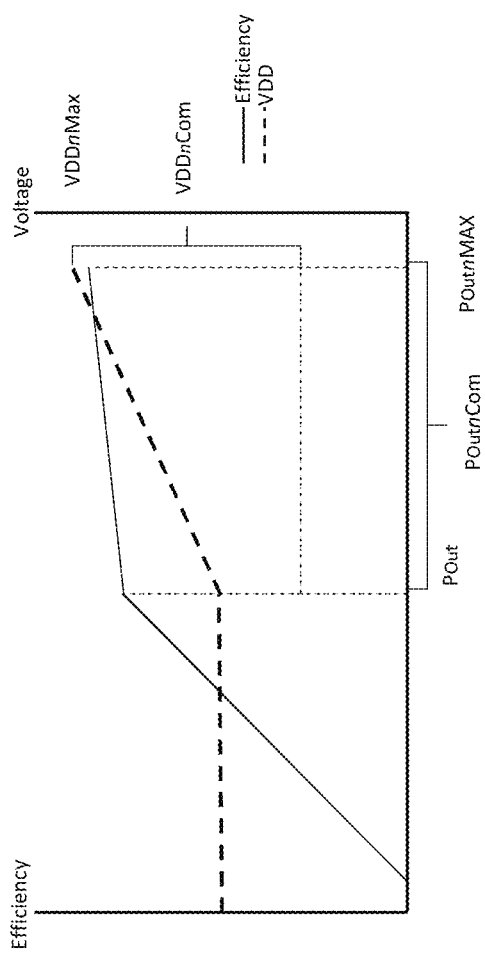
FIG. 8 is a graph indicative of characteristics of a power amplifier.

For example, such characterization may produce a plot or table similar to that shown in FIG. 8.

The plot or table may be used to generate values which populate the above-mentioned reference data for the relevant PA, indexed n.

FIG. 8 is a plot that represents the efficiency of the characterized PA. For illustration, we may assume that the plot refers to characteristics of the first PA 122, versus output power (POut) and the drain voltage VDD required to achieve different values of POut over a given range.

The value of VDDnMax indicates the maximum drain voltage of the relevant PA.

The range VDDnCom indicates the drain voltage adjustment range of the relevant PA.

The value of POutnMax indicates the maximum output power (POut) of the relevant PA.

The value of POutnCom indicates the range of output powers (POut) required of the relevant PA. This range may be set by, for example, the customer or target market of the RFM 110 and/or by RF emission standards of a given region, territory or country.

The FIG. 8 plot also indicates that the efficiency of either PA can be almost constant relative to POut over the full drain voltage adjustment range VDDnCom which may be limited by the transistor technology used.

Variations in gate bias voltage Vgs, in addition to variations in VDD, may also be required to achieve improved and/or optimal efficiency. Thus, a multidimensional plot similar to FIG. 8 may be produced during characterization testing to identify values of other settable parameters, such as Vgs and/or compensation voltages for temperature, which collectively provide an improved and/or optimal efficiency over the POutnCom range.

Figure 9:
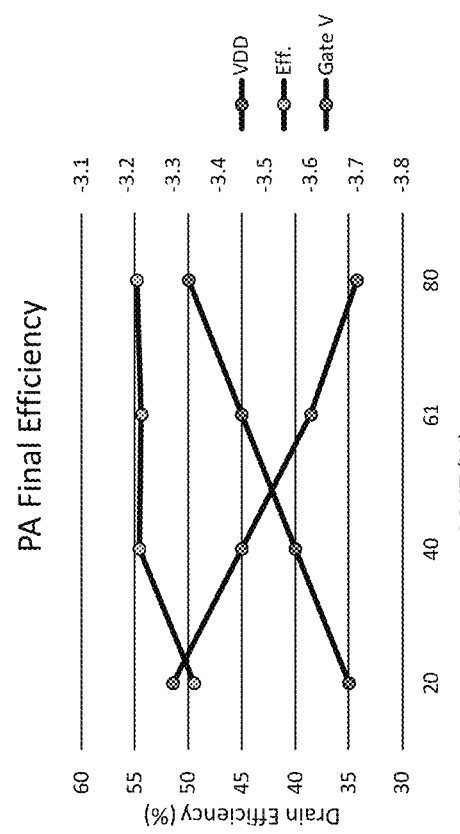
FIG. 9 is further graph indicative of characteristics of a power amplifier.

FIG. 9 is a plot that represents example efficiencies of the characterized first PA 122, taking into account variations in gate bias voltage Vgs also. The FIG. 9 plot maps to the values of the first LUT 401 in FIG. 4. Specifically, FIG. 4 shows values of VDD, Vgs and temperature compensation voltage (Tc) required for specific values of POut. Tc may comprise a separate table that goes from approximately −40 to 150 degrees Celsius, in for example steps of 5 degrees Celsius. For each step, there may be a delta voltage from the assigned value of Vgs. Hence, Tc may not be an entirely linear function and can have difference slopes for hotter and colder temperatures. Typically, however, the delta voltage is in the range of +/−0.05 volts.

The first PA 122 is assumed to be a 2.1 GHz narrow band 80 W GaN PA. As can be seen, the first PA 122 can achieve almost constant efficiency of approximately 54.5% from 80 W down to 40 W (3 dB range), and as high as 49.5% at 20 W (6 dB back off). A 1.9 GHz device may have very similar characteristics. Therefore, the combined drain efficiency to cover both bands for that antenna will be ~50% efficiency. A similarly sized 80 W wideband GaN final device that covers both bands has been measured to be ~42% efficient at a fixed voltage of 50V, being a difference of 8% just on the final device alone. Also, depending on driver selection, the difference between the two solutions could be >10% pts in power consumption savings per PA, since a wideband driver will inherently have lower efficiency than a narrow band.

The RFM 110 when deployed to a customer site, is pre-configured by the manufacturer by means of the populated set of reference data 306 stored in the DFE 112. In use, any desired value of POut requested by the customer or operator can form an input to the controller 304 which, by virtue of its configured operation, may fetch the required values of VDD, Vgs and any other settable parameter in the reference data 306 to achieve that value of POut with required performance characteristics. For example, a computer program associated with the controller 304 may provide a user interface to enable a customer to input the desired value of POut. Thereafter, the controller 304 may fetch the settable parameter values from the reference data 306 and issue one or more control signals to the PA power supplies 126 over control line 150 for setting voltage characteristics for the required value of POut.

An example scenario will now be described for illustration.

At commissioning, the RFM 110 may be setup based on the following formula:

$$\Sigma_{n=1}^{k} POUT_n COM \leq POUT_{ANT} COM \quad (1)$$

where k is the number of bands (or PAs), n is the band/PA index, $POUT_n COM$ is the commissioned output power and $POUT_{ANT} COM$ is the commissioned output power of the antenna 140.

Figure 10:
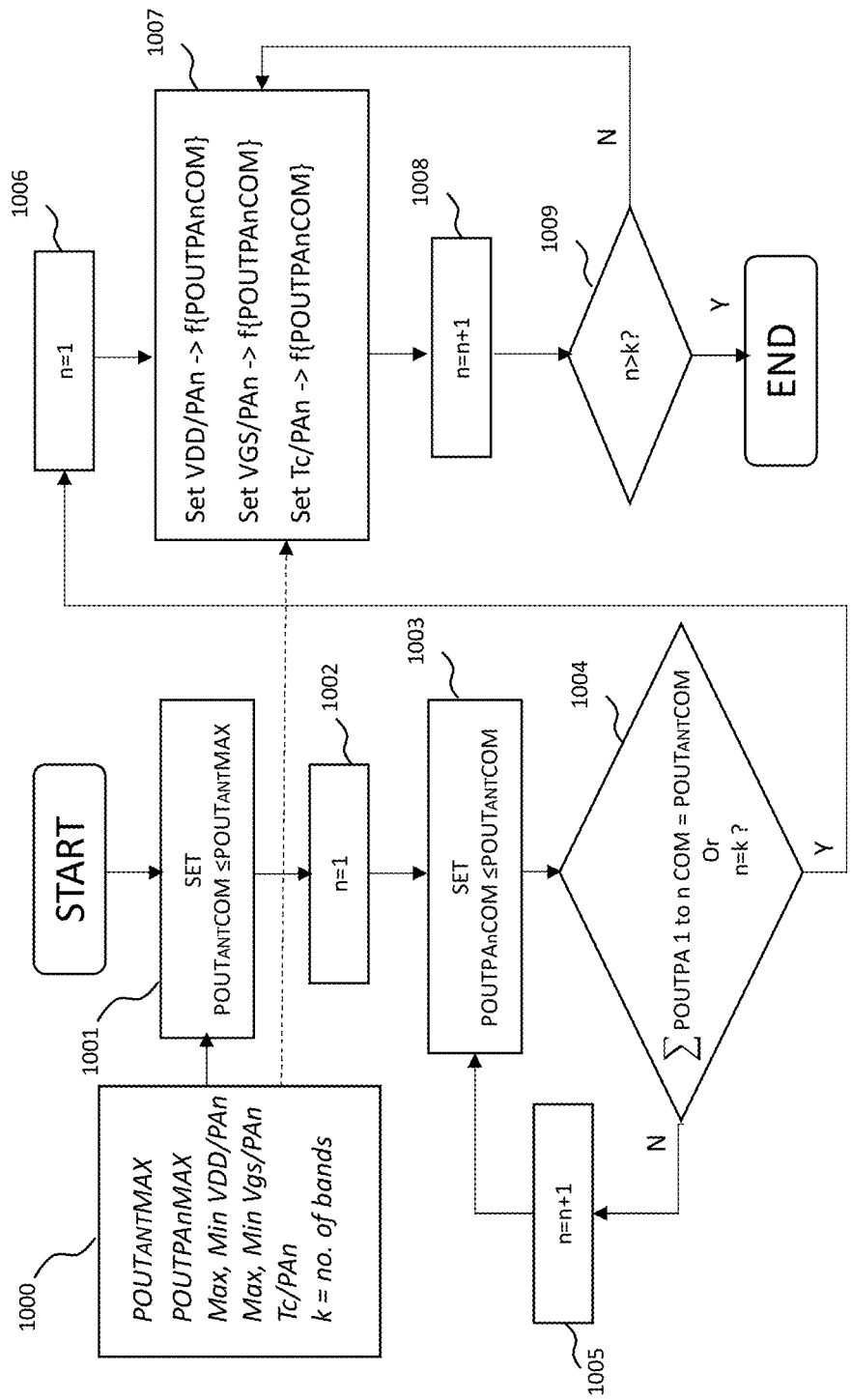
FIG. 10 is a flow diagram indicative of processing steps according to one or more example embodiments.

FIG. 10 is a flow diagram indicating how the formula (1) may be implemented.

The flow diagram may comprise operations, some of which may be processing operations performed by the controller 304, for example in association with software and/or firmware, wherein input operations may be performed using a suitable user interface which is presented via a display screen.

The box 1000 indicates a set of hardware constraints or factory settings for the particular RFM 110, including:

POUTANTMAX: maximum output power of the antenna 140;

POUTPAnMAX: maximum output power for each PA;

Max, Min VDD/PAn: maximum and minimum values of VDD for each PA;

Max, Min Vgs/PAn: maximum and minimum values of Vgs for each PA;

Tc/PAn: Temperature Compensation voltage for each PA; and k: number of bands or PAs.

POUTANTMAX may be the maximum power that the RFM 110 is rated to for thermal management. POUTPAnMAX may or may not have the same value as POUTANTMAX. For example, the VDD for a GaN device can range from 32-54 volts and Vgs for the characterisation over that range can be −3.3 to −3.7 volts. The Vgs range may vary from device to device, and from manufacturer to manufacturer. As noted, Tc can be +/−0.05 v per every 5 degrees Celsius in a range from −40 to 125 degrees Celsius. This assumes a linear function compensation which is not necessarily always the case. There may be different slopes throughout the range which can be negative or positive slopes.

One operation 1001 may comprise setting the value of $POUT_{ANT}COM$ which cannot exceed the value of POUTANTMAX.

Another operation 1002 may comprise setting n to 1.

Another operation 1003 may comprise setting a value of POUTPAnCOM, being the commissioned power for the first PA which cannot exceed the value of $POUT_{ANT}COM$.

Another operation 1004 may comprise determining if the accumulation of POUTPAnCOM=$POUT_{ANT}COM$ or if n=k.

If not, then another operation 1005 increments n and returns to operation 1003. If so, then the process moves to another operation 1006 wherein the value of n=1.

Another operation 1007 sets, for the first PA, values of VDD, Vgs and Tc for achieving the value of POUTPA1COM based on the reference data 306 stored in the DFE 112.

Another operation 1008 increments n and, unless n is greater than k (operation 1009) the process returns to operation 1007 to set, for the second PA, values of VDD, Vgs and Tc for achieving the value of POUTPA2COM.

The process ends when operation 1009 determines that n is greater than k.

Figure 11:
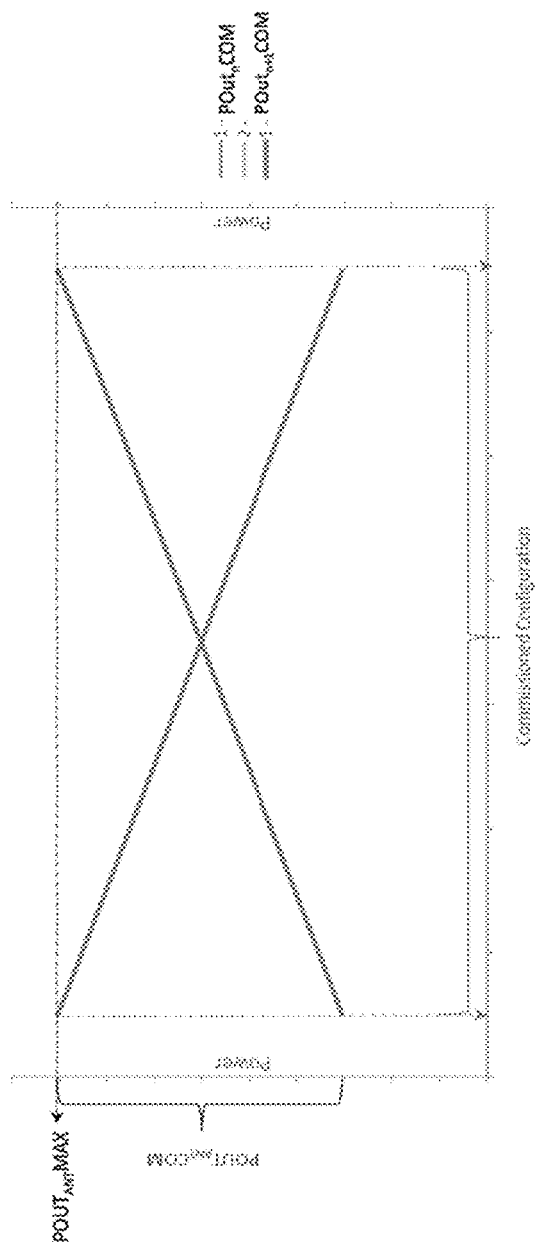
FIG. 11 is a graph indicative of power sharing capability between first and second power amplifiers according to one or more example embodiments.

FIG. 11 shows how the RFM 110 may set the power per PA for power sharing over two bands. The diagonal lines represent the configured output power of each PA (per band) to satisfy the commissioned power per antenna. In this example, POUTANTMAX is equal to the maximum power of each individual PA, i.e. POUTPAnMAX.

This implies that radio thermal performance may limit the total output power, but that total output power could be assigned to either band, or shared between the two bands.

Moving left to right in the 'commissioned configuration' axis, the power sharing ratio between the two PA's goes from 100/0% to 0/100%.

For dynamic power sharing, the ratios can be re-adjusted in real time to comply with traffic loading per frequency band, within the maximum power commissioned for the antenna.

WORKED EXAMPLE

Assume the RFM 110 is set at the factory for two bands per antenna (k=2), the first band being 1.9 GHz and the second band being 2.1 GHz. Assume each PA per band is capable of 80 W ($POUTPA_n MAX$, for n=1, 2), the maximum power per antenna is limited to 80 W ($POUT_{ant}MAX$), and that values of VDD, Vgs and Tc are stored as the reference data 306.

The customer may have a site where the maximum power per antenna is 80 W. This $POUT_{ant}COM$ (which is also $POUT_{ant}MAX$), the commissioned power per antenna, and is one of the input parameters given by the customer at commissioning.

Based on $POUT_{ant}COM$ set by the customer, the FIG. 10 algorithm will only allow select combinations of power between the two bands that add up to $POUT_{ant}COM$ (or less) which, in this case, is 80 W. The customer decides that the first band will have a maximum power of 40 W ($POUTPA_1COM$) and therefore the second band can only have a maximum of 40 W ($POUTPA_2COM$).

Assuming those are the final commissioned powers per band for that antenna, the algorithm will access the values of VDD, Vgs and Tc for each PA and use those as the default parameters for that commissioned antenna.

Figure 12:
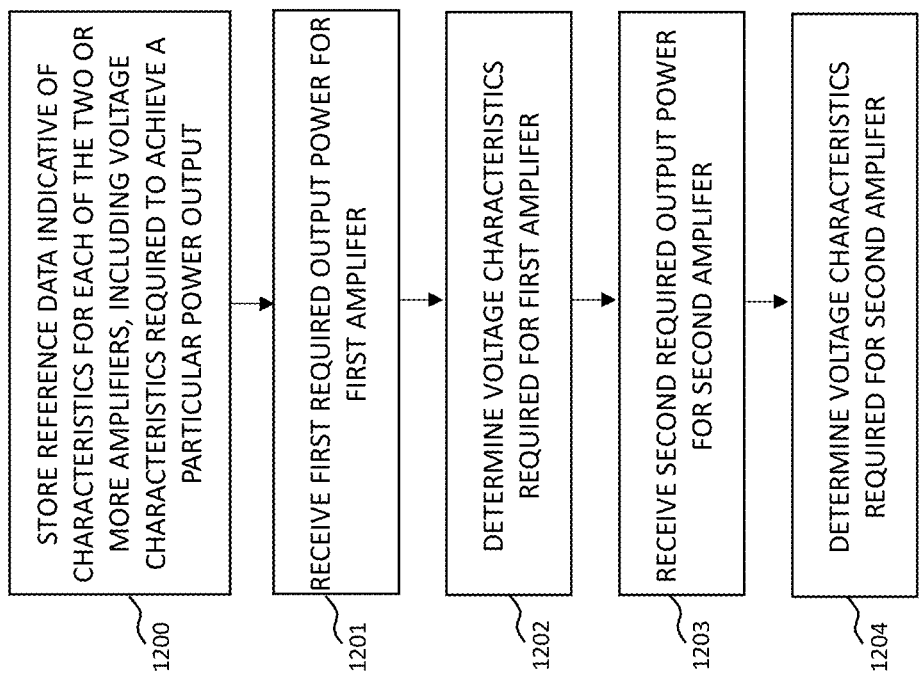
FIG. 12 is a flow diagram indicative of processing steps according to one or more example embodiments.

FIG. 12 is a flow diagram showing processing operations that may be performed, for example by the controller 304 or any processing element of the DFE 112.

A first operation 1200 may comprise storing reference data indicative of characteristics for each of the two or more amplifiers, the reference data including voltage characteristics required by the particular amplifier to achieve a particular output power of a range of output power values.

A second operation 1201 may comprise receiving a first required output power for a first amplifier.

A third operation 1202 may comprise determining voltage characteristics required for the first amplifier.

A fourth operation 1203 may comprise receiving a second required output power for a second amplifier.

Alternative embodiments may be envisaged. For example, some or all of the reference data 306 may be stored on a memory of, or associated with, the particular PA 122, 124 which that reference data characterises. For example, the controller 304 may access the reference data 306 from the PA's memory and subsequently may be configured to set its configuration based on said reference data.

For the avoidance of doubt, parameterization of the two or more PAs 122, 124 can be extended to any other component or stage in the PA's processing chain in order to achieve, for example, the one or more predetermined performance requirements such as one or more of an improved or optimal efficiency, group delay variation and out-of-band rejection.

Although embodiments focus on the particular topologies shown in FIGS. 1 and 3, this does not preclude the means and methods being applied to, for example, Doherty amplifiers and/or those using SDVM-DVM, gate modulation, envelope tracking (ET) methods etc. Embodiments are not bounded by the number of PAs or by frequency, power, technology, or topology of the intended products.

Figure 13:
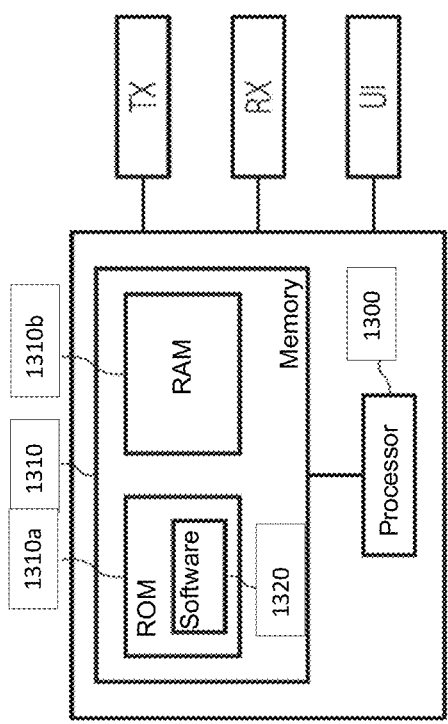
FIG. 13 is a schematic view of an apparatus which may be configured to perform operations according to one or more example embodiments.

FIG. 13 is an apparatus that may comprise, for example, the controller 304 or any processing element of the DFE 112. The apparatus may comprise of at least one processor 1300 and at least one memory 1310 directly or closely connected or coupled to the processor. The memory 1310 may comprise at least one random access memory (RAM) 1310a and at least one read-only memory (ROM) 1310b. Computer program code (software) 1320 may be stored in the ROM 1310b. The apparatus may be connected to a transmitter path and a receiver path in order to obtain respective signals or data. The apparatus may be connected with a user interface (UI) for instructing the apparatus and/or for outputting data. The at least one processor 1300 with the at least one memory 1310 and the computer program code 1320 may be arranged to cause the apparatus to at least perform methods described herein.

The processor 1300 may be a microprocessor, plural microprocessors, a microcontroller, or plural microcontrollers.

The memory may take any suitable form.

Figure 14:
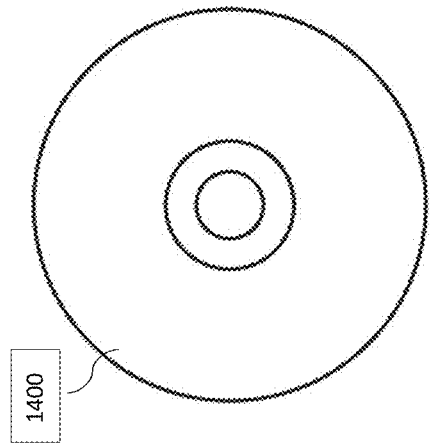
FIG. 14 is a non-transitory storage medium for storing computer-readable code for performing operations according to one or more example embodiments.

FIG. 14 shows a non-transitory media 1400 according to some embodiments. The non-transitory media 1400 is a computer readable storage medium. It may be e.g. a CD, a DVD, a USB stick, a blue ray disk, etc. The non-transitory media 1400 stores computer program code causing an apparatus to perform operations described above when executed by a processor such as processor 1300 of FIG. 13.

Any mentioned apparatus and/or other features of particular mentioned apparatus may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some examples, a particular mentioned apparatus may be pre-programmed with the appropriate software to carry out desired operations, and wherein the appropriate software can be enabled for use by a user downloading a "key", for example, to unlock/enable the software and its associated functionality. Advantages associated with such examples can include a reduced requirement to download data when further functionality is required for a device, and this can be useful in examples where a device is perceived to have sufficient capacity to store such pre-programmed software for functionality that may not be enabled by a user.

Any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

Any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

The term "signalling" may refer to one or more signals transmitted as a series of transmitted and/or received electrical/optical signals. The series of signals may comprise one, two, three, four or even more individual signal components or distinct signals to make up said signalling. Some or all of these individual signals may be transmitted/received by wireless or wired communication simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to examples thereof, it will be understood that various omissions and substitutions and changes in the form and details of the devices and methods described may be made by those skilled in the art without departing from the scope of the disclosure. For example, it is expressly intended that all combinations of those elements and/or method steps which perform substantially the same function in substantially the same way to achieve the same results are within the scope of the disclosure. Moreover, it should be recognized that structures and/or elements and/or method steps shown and/or described in connection with any disclosed form or examples may be incorporated in any other disclosed or described or suggested form or example as a general matter of design choice. Furthermore, in the claims means-plus-function clauses are intended to cover the structures described herein as performing the recited function and not only structural equivalents, but also equivalent structures.

The invention claimed is:

1. An apparatus, comprising:
a memory to store reference data indicative of characteristics for each of two or more amplifiers for amplifying signals in two or more respective bands, the reference data including voltage characteristics required by a particular amplifier to achieve a particular output power for a range of output power values for its respective frequency band while meeting one or more predetermined performance requirements, wherein stored voltage characteristics comprise a drain voltage and a gate bias voltage required for the particular amplifier to achieve the particular output power for its respective radio frequency band; and
a receiver to receive at least a first required output power for a first amplifier and a second required output power for a second amplifier,
wherein the apparatus is configured to determine, based on the reference data, the voltage characteristics required for the first amplifier to achieve the first required output power and the voltage characteristics required for the second amplifier to achieve the second required output power, and
wherein the one or more predetermined performance requirements comprise one or more of maintain group delay variation and an out-of-band rejection.

2. The apparatus of claim 1, wherein the stored voltage characteristics further comprise a value of temperature compensation.

3. The apparatus of claim 1, wherein the stored voltage characteristics comprise values determined in a testing phase when the two or more amplifiers and/or signal processing components associated with the two or more amplifiers are configured to meet the one or more predetermined performance requirements.

4. The apparatus of claim 3, further comprising a filter associated with each amplifier of the two or more amplifiers, wherein, in the testing phase, the filters are configured to meet the one or more predetermined performance requirements.

5. The apparatus of claim 4, wherein the filters are configured by setting to skew their respective centre frequencies with respect to that of a linearizing by a linearizer associated with the same radio frequency band, wherein the respective centre frequencies are skewed in opposite directions.

6. The apparatus of claim 5, wherein the centre frequency is skewed with respect to that of the linearizing by the linearizer such as to set or maintain group delay variation below a predetermined threshold.

7. The apparatus of claim 5, wherein the centre frequency is skewed with respect to that of the linearizing by the linearizer such as to provide an out-of-band rejection characteristic above a predetermined threshold.

8. The apparatus of claim 1, further comprising a transmitter to transmit an indication of the determined voltage characteristics to a power supply associated with the two or more amplifiers.

9. The apparatus of claim 1, wherein the reference data is preconfigured in the memory prior to deployment.

10. The apparatus of claim 1, wherein the reference data is stored in a look-up table or an array in the memory.

11. The apparatus of claim 1, wherein the apparatus is configured to compute required output power values for the two or more amplifiers based on a commissioned total power specified for the apparatus.

12. The apparatus of claim 11, wherein the apparatus is further configured to:
receive a first input indicative of the commissioned total power;
receive a second input indicative of a first commissioned output power value for the first amplifier of the two or more amplifiers;
set the first commissioned output power value as the first required output power if the first commissioned output power value does not exceed the commissioned total power;
receive a third input indicative of a second commissioned output power value for the second amplifier of the two or more amplifiers; and
set the second commissioned output power value as the second required output power if, when summed with the first commissioned output power value, the second commissioned output power value does not exceed the commissioned total power.

13. A method comprising:
storing reference data indicative of characteristics for each of two or more amplifiers for amplifying signals in two or more respective bands, the reference data including voltage characteristics required by a particular amplifier to achieve a particular output power for a range of output power values for its respective frequency band while meeting one or more predetermined performance requirements, wherein the stored voltage characteristics comprise a drain voltage and a gate bias voltage required for the particular amplifier to achieve the particular output power for its respective radio frequency band;

receiving at least a first required output power for a first amplifier and a second required output power for a second amplifier; and determining, based on the reference data, the voltage characteristics required for the first amplifier to achieve the first required output power and the voltage characteristics required for the second amplifier to achieve the second required output power, wherein the one or more predetermined performance requirements comprise one or more of maintain group delay variation and an out-of-band rejection.

14. A method, comprising:

determining reference data indicative of characteristics for each of two or more amplifiers of a radio apparatus, wherein the amplifiers are configured for amplifying respective signals in respective different frequency bands, the reference data including voltage characteristics required by a particular amplifier to achieve each of a range of output power values for its respective frequency band while meeting one or more predetermined performance requirements, wherein the voltage characteristics comprise a drain voltage and a gate bias voltage required for the particular amplifier to achieve a particular output power for its respective radio frequency band, wherein the method comprises determining the voltage characteristics in a testing stage when the two or more amplifiers and/or signal processing components associated with the two or more amplifiers are configured to meet the one or more predetermined performance requirements, and wherein the one or more predetermined performance requirements comprise one or more of maintain group delay variation and an out-of-band rejection.

* * * * *